United States Patent [19]
Krajec

[11] Patent Number: 6,097,334
[45] Date of Patent: Aug. 1, 2000

[54] QUICKLY REMOVABLE RF SEALED COVER FOR TEST FIXTURE

[75] Inventor: Russell S. Krajec, Berthoud, Colo.

[73] Assignee: Agilent Technologies, Palo Alto, Calif.

[21] Appl. No.: 09/026,065

[22] Filed: Feb. 19, 1998

[51] Int. Cl.[7] ...................................................... G01S 7/41
[52] U.S. Cl. ............................................. 342/165; 29/445
[58] Field of Search ................................ 342/165; 29/445

[56] References Cited

U.S. PATENT DOCUMENTS

| | | | |
|---|---|---|---|
| 4,800,387 | 1/1989 | Joy | 342/165 |
| 5,028,928 | 7/1991 | Vidmar et al. | 342/165 X |

Primary Examiner—Thomas P. Noland

[57] ABSTRACT

The inventive connection mechanism uses a tongue and groove connection in combination with a RF gasket. Fixture panels are constructed by placing the tongue of one panel into the groove of another panel. The gasket is pre-positioned in the groove, such that the tongue compresses the gasket to the manufacture's specified compression thickness. The panels can then be secured using fasteners. RF fixtures constructed with such connection mechanisms can be rapidly assembled. Moreover, the RF fixtures can be rapidly taken apart to allow for maintenance of the internal elements of the fixture. The use of the tongue and groove connection with the RF gasket provides an RF sealed connection. Thus, the fixture is not subject to interference from undesirable external RF signals.

19 Claims, 3 Drawing Sheets

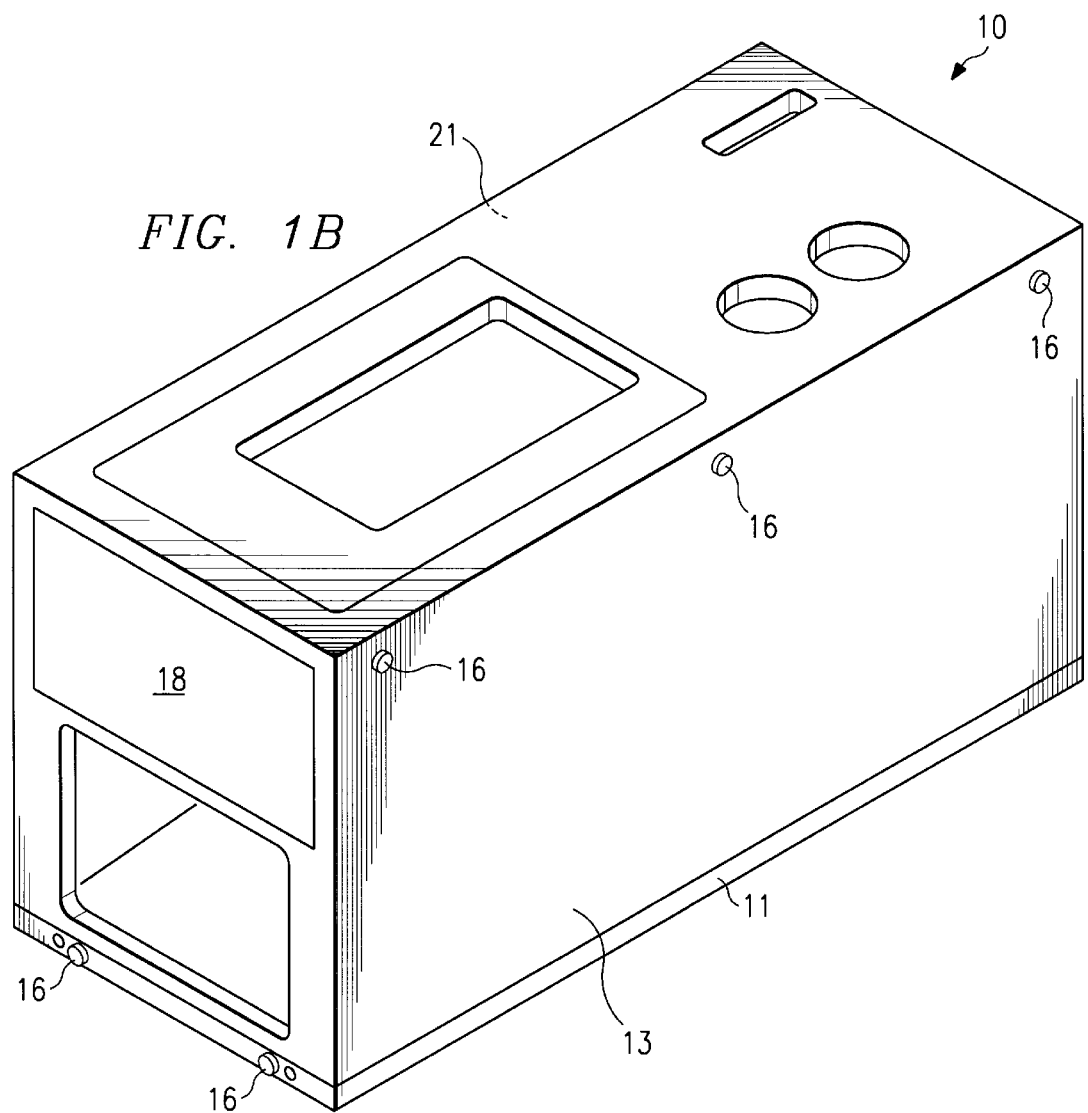

QUICKLY REMOVABLE RF SEALED COVER FOR TEST FIXTURE

REFERENCE TO RELATED APPLICATIONS

The present application is being concurrently filed with commonly assigned U.S. patent applications Ser. No. 09/025,982 entitled "DOCKING STATION FOR AUTOMATED COMMUNICATIONS TEST FIXTURE", the disclosure of which is incorporated herein by reference; Ser. No. 09/026,307 entitled "DRAWER STYLE FIXTURE WITH INTEGRAL RF DOOR", the disclosure of which is incorporated herein by reference; Ser. No. 09/026,083 entitled "REMOVABLE FIXTURE ADAPTER WITH RF CONNECTIONS", the disclosure of which is incorporated herein by reference; and Ser. No. 09/026,066 entitled "REMOVABLE FIXTURE ADAPTER WITH PNEUMATIC ACTUATORS", the disclosure of which is incorporated herein by reference.

TECHNICAL FIELD OF THE INVENTION

This application relates in general to automatic testing machines, and in specific to a RF cover or panel that is connected to a fixture via a tongue and groove attachment mechanism.

BACKGROUND OF THE INVENTION

An automatic testing machine (ATM) operates in a production environment to rapidly and accurately test the operation and performance of various types of devices under test (DUT), including RF communication devices. The DUTs could be a finished product or a component of a larger system.

The ATM is programmed to perform various tests on the DUT automatically. For example, RF signals are transmitted to a finished cellular telephone DUT to determine if the telephone activates. Other tests could include environmental tests, such as temperature or vibration tests.

Depending upon the nature and number of the tests being performed, the testing may last from a couple of milliseconds to several minutes. The information from the testing is compared with expected test results. If there is some defect so that the DUT falls below specifications, the ATM will designate the DUT as failed, either by marking the DUT, placing the DUT in a failure area, or indicating the failure to an operator.

The ATM is then loaded with the next DUT, either manually or automatically, and the testing procedure is repeated for this DUT. The information from the testing can be used to evaluate the fabrication process for possible changes, as well as to perform failure analysis on individual failed devices.

Typically, each ATM is designed to perform a specific class of tests on the DUT, and are not able to perform other classes of tests. For example, a vibration ATM may not be able to perform electrical signal tests. However, different types of DUTs may require the same tests to be performed. For example, all types of microcomputer chips are tested for electronic performance characteristics, but different chips will have different locations for power, inputs and outputs. ATMs are made flexible by the use of test fixtures. The test fixture provides an interface between the device under test DUT and the ATM. Thus, a single ATM can perform tests on different types of devices when connected via different fixtures.

A particular class of fixtures are RF fixtures. RF fixtures are used in the testing of DUTs that operate with radio waves, e.g. cellular telephones, pagers, CB radios, etc. The RF fixture is sealed such that external electromagnetic fields or radio waves do not affect the testing of the DUT. Thus, the RF testing being performed on the DUT will be performed accurately, as the DUT will receive only the test RF signals and not any external RF signals which may skew the operation of the DUT. The RF seal is critical to ensure proper testing of the DUT. If the RF seal should leak, external RF signal could enter the test fixture and interfere with RF testing of the DUT, resulting in the collection of incorrect information about the DUT. The incorrect information could lead to improperly passing a defective DUT or failing a passing DUT. The incorrect information may also result in incorrect or unnecessary changes being made to the production process.

The RF sealing requirements make it difficult for RF fixtures to be properly constructed. A large number of screws are used to secure the sides of the RF fixture cabinet. Gaskets may be used to seal the panels. For example, as shown in FIG. 3, 28 screws 33 are used to secure right side panel 32 of fixture 31 to top side panel 34, and 28 screws 33 are used to secure front side panel 35 to top side panel 34, right side panel 32, left side panel (not shown), and bottom side panel (not shown). Similar amounts of screws would be used to secure the right side panel (not shown) and the back side panel (not shown) for a total of 112 screws 33. The number and location of the screws is by way of example only, as the precise number and placement depends upon the size and shape of the fixture, with the main consideration being to provide a proper RF seal.

The large number of screws causes the fabrication process of the fixtures to be very time consuming. Each screw must be precisely placed and properly tightened. If the screw is too loose then the seal at that particular location is poor. If the screw is too tight, then this may cause the side panel to buckle and result in a poor seal. Furthermore, a screw that is too tight may strip and thus result in a poor seal at that location. Also, a screw that is overly tightened may result in a stripped or broken screw head, which must be drilled out and replaced or a poor seal will result at that location. Frequently, during fabrication of the RF fixture, many of the screws are not installed, thus leaving the fixture susceptible to RF interference.

Maintenance of the RF fixture is also a problem. To service the internal elements of the RF fixture at least one side needs to be opened, thus each screw around the periphery must be removed in order to remove the side. For example, as shown in FIG. 3, in order to remove right side 32, each of row of screws 33 on the top and bottom portions of right side 32 must be removed. Moreover, the right side column of screws 33 of both front side 35 and rear side (not shown) must also be removed in order to remove right side 32, yielding a total of 44 screws that must be removed. In addition, more than one side panel typically needs to be removed to service the fixture. And frequently, after the maintenance of the RF fixture has been completed, not all of the screws are re-installed, thus leaving the fixture susceptible to RF interference. Also, if the screws are replaced, the fabrication problems resulting from under and over tightening may occur during maintenance. Furthermore, during maintenance of the fixture, the production line may be shut down if a replacement fixture is not available, which results in lost production time. Thus, the time required to open and close a RF fixture can greatly affect production.

Therefore, there is a need in the art for a system and method that allows for the rapid and reliable installation of RF sealed fixture side panels.

SUMMARY OF THE INVENTION

These and other objects, features and technical advantages are achieved by a system and method which uses a tongue and groove connection method in combination with a RF gasket to provide a rapid mechanism for installing RF fixture side panels, while providing a reliable RF seal.

The RF sealed connection is formed by placing the tongue of one fixture panel into the groove of another fixture panel. The gasket is prepositioned in the groove, such that the tongue compresses the gasket to the manufacture's specified compression thickness. The panels can then be secured to each other using fasteners.

RF fixtures constructed with such connection mechanisms can be rapidly assembled. Moreover, the RF fixtures can be rapidly taken apart to allow for maintenance of the internal elements of the fixture. The use of the tongue and groove connection with the RF gasket provides an RF sealed connection. Thus, the fixture is not subject to interference from undesirable external RF signals.

A technical advantage of the present invention is the use of a tongue and groove connection in combination with a RF gasket to provide an RF sealed connection.

Another technical advantage of the present invention is that two panels forming such a RF sealed connection can be secured to each other by fasteners.

A further technical advantage of the present invention is that the use of fasteners allows the rapid construction and subsequent disassembly of RF sealed fixtures.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A and 1B depict fixture panels coupled with the inventive mechanism;

DESCRIPTION OF THE PREFERRED EMBODIMENTS

Figure 1A:
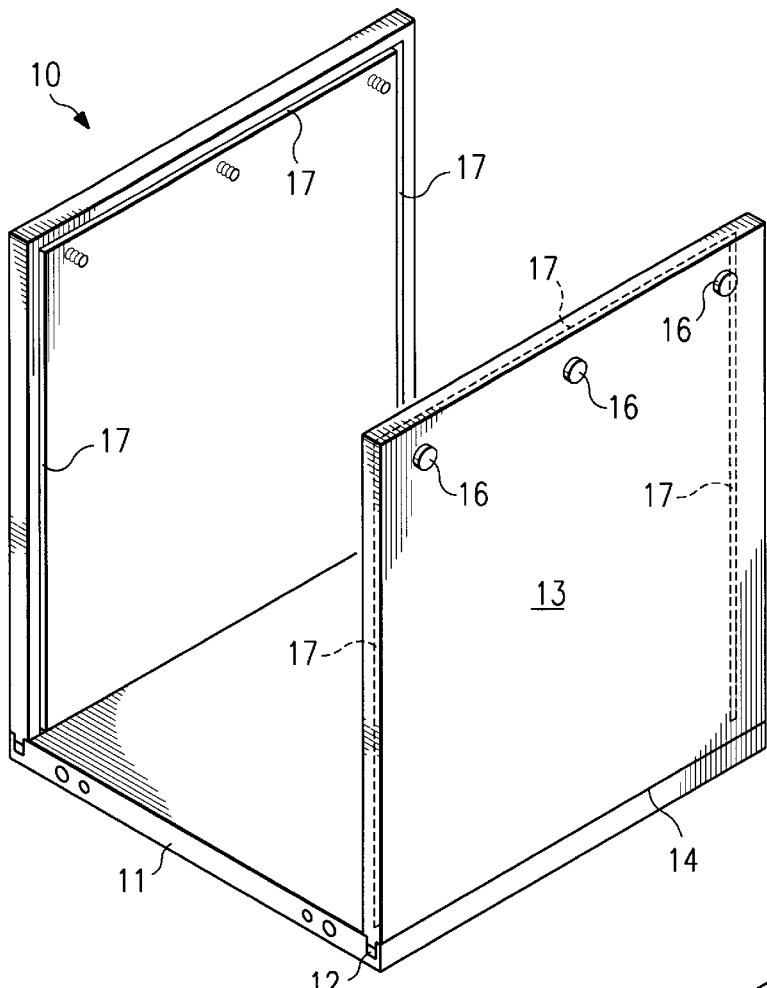
Figure 3:
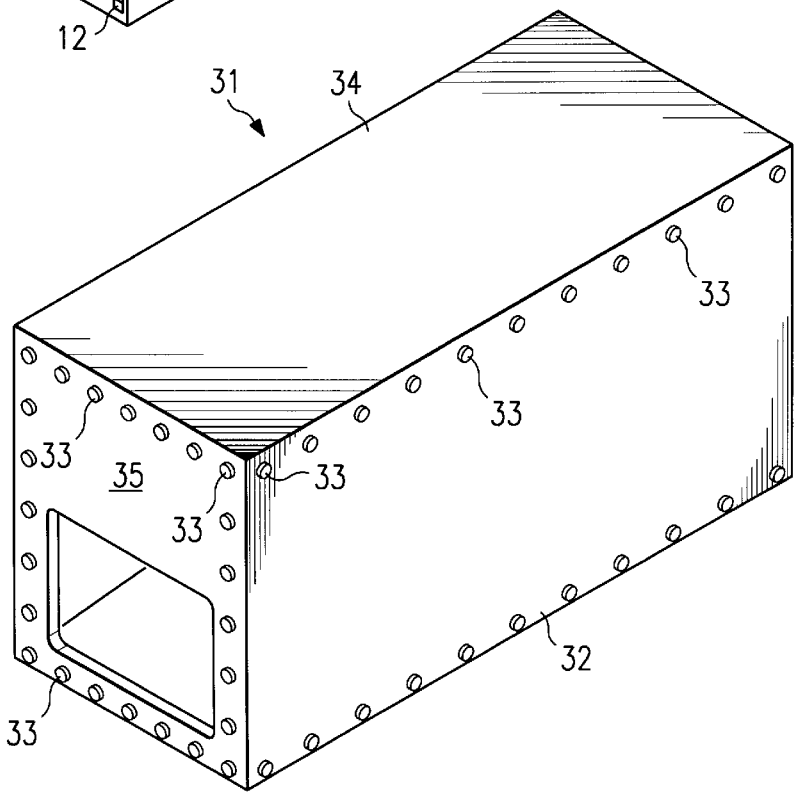
FIG. 3 depicts a prior art fixture using screws.
Figure 2A:
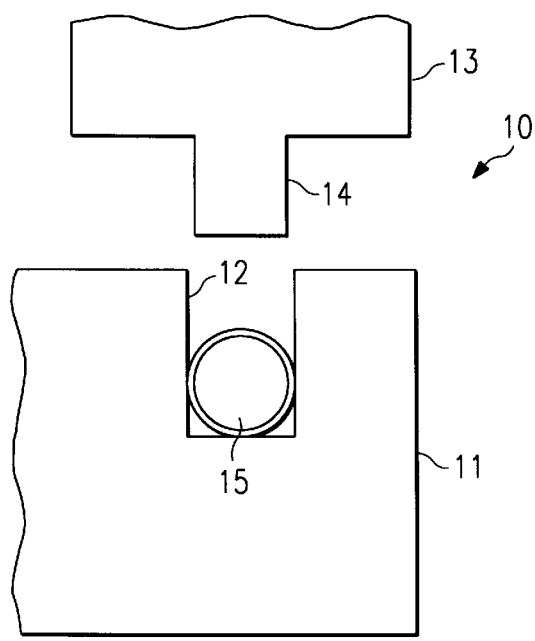
FIGS. 2A, 2B, 2C, and 2D depict the interaction of the tongue, the groove, and the gasket.

FIG. 1A depicts a portion of the inventive RF fixture 10 with fixture base 11 having groove 12 located in an outer peripheral portion of base 11. As shown in FIG. 2A, side panel 13 has a complementary tongue 14 located on a lower peripheral portion which is designed to fit into groove 12. To facilitate placement of tongue 14 into groove 12, the width tongue 14 should be approximately ¾ the width of groove 12. RF gasket 15 is located within groove 12. RF gasket 15 is a woven metal tube which inhibits the passage of unwanted RF signals. The length of tongue 14 depends upon the required compression of RF gasket 15. The required compression is dictated by the manufacturer of gasket 15.

Figure 2B:
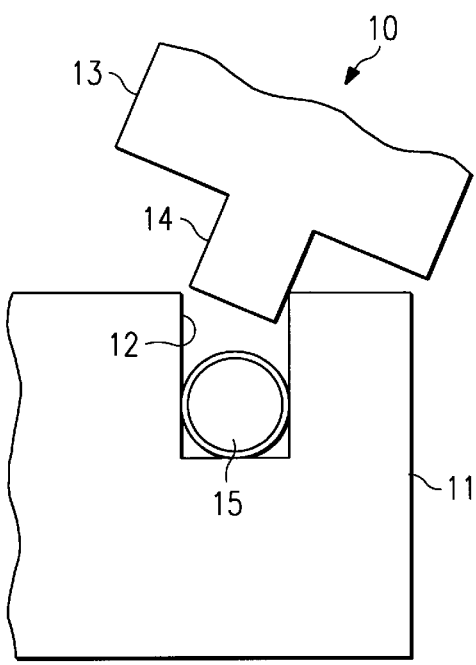
Figure 2C:
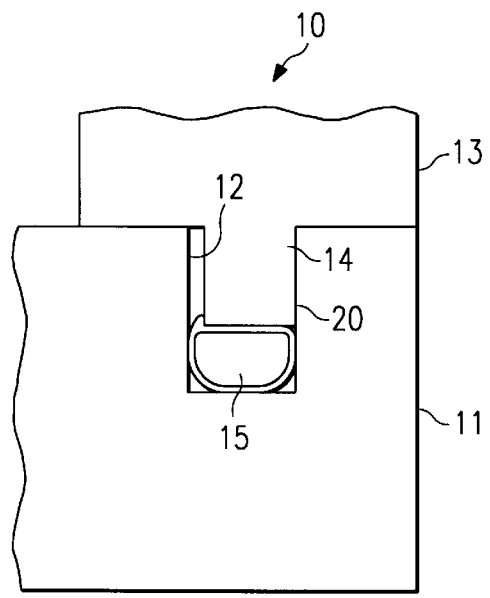

FIGS. 2A–2C depict the interaction of tongue 14 and groove 12 during installation of side panel 13. Side panel 13 is positioned above base portion 11. Side panel 13 is then tipped or rotated at an angle, away from base portion 11. Tongue 14 is then inserted into groove 12, and side panel 12 is rotated back into the vertical position. This results in the arrangement shown in FIG. 2C, wherein edge 20 of the tongue firmly contacts the corresponding edge of groove 12. RF gasket is now compressed to the manufacturer's specification. Side panel 13 is then secured to a top panel 21 via three ¼ turn captive fasteners 16. Other types of fasteners could be used. The number and location of the fasteners is by way of example only, as the precise number and placement depends upon the size and shape of the fixture. However, fasteners need only secure the panel to the fixture, as the RF seal is provided by the RF gasket, and the tongue and groove connection.

Figure 2D:
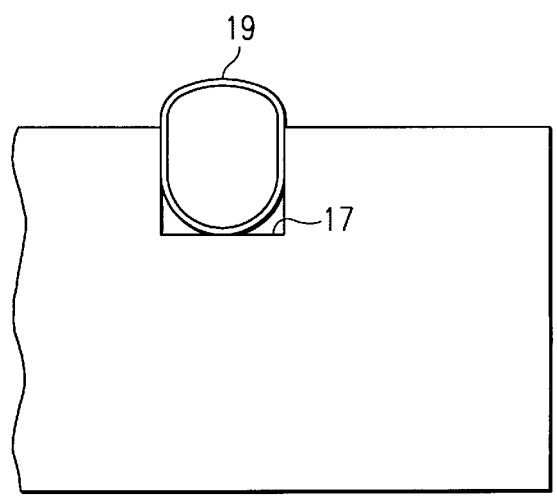

Side panel has a groove 17 on the remaining three sides located peripherally on the inner face of the panel. As shown in FIG. 2D, groove 17 is also filled with RF gasket 19, which may be the same size and type as gasket 15, or it may be a different size to accommodate a different sized groove or a different type in order to satisfy RF sealing requirements. Front side panel 18, top side panel 21, and rear side panel, each have a flat surface which compresses gasket 19, when gasket 19 contacts the respective surfaces. Thus, during installation of panel 13, panel 13 is tilted as shown in FIG. 2B to prevent gasket 19 from becoming displaced, which would occur if panel 13 is slid in to groove 12 straight down. Fasteners 16 are then used to secure side panel 13 to top panel 17. Note that the compression of gasket 19 on three sides of panel 13 causes edge 20 of tongue 14 to contact the side of groove 12 as shown in FIG. 2C.

As shown in FIG. 1B, front side panel 18, top side panel 21, and rear side panel could be made integral with each other to form a frame to which side panels 13 and base portion 11 are connected. Thus, side panel 13 is connected to fixture 10 via a tongue and groove connection and approximately three fasteners. Consequently, the removal and subsequent re-installation of side panel 13 can be accomplished very quickly, while still maintaining a RF seal, thus providing a RF sealed area for testing the device.

An alterative arrangement of side panel 13 is to have a groove 17 around the whole perimeter of the side panel 13. Tongue 14 would be located in base portion 11 in place of groove 12. Groove 17 is filled with RF gasket 15 that forms a continuous loop around the perimeter. Groove 17 would then be connected to corresponding tongue portions of the front side panel 18, top side panel 21, rear side panel (not shown), and base panel 11. The connections would be made with the according to the arrangement as shown in FIG. 2C or FIG. 2D.

Note that the RF seal also prevents the RF signals generated within the fixture from leaking out and interfering with other ATMs that are closely located to the RF testing ATM. The invention has applications beyond RF testing, for example the invention may be used to provide an RF sealed area around computer for security reasons.

Although the present invention and its advantages have been described in detail, it should be understood that various changes, substitutions and alterations can be made herein without departing from the spirit and scope of the invention as defined by the appended claims.

What is claimed is:

1. An RF sealed fixture used in testing an RF device, the fixture comprises:
   a first panel with a groove positioned along a first peripheral edge of the first panel;
   a second panel with a tongue protruding from a first peripheral edge of the second panel, with the tongue designed to fit into the groove;
   a first RF gasket positioned in the groove;
   wherein the tongue is inserted into the groove, which compresses the first RF gasket to a predetermined dimension, and provides an RF sealed connection between the first panel and the second panel.

2. The fixture of claim 1, further comprising:
   at least one fastener to secure the second panel to a third panel.

3. The fixture of claim 2, wherein:
   the fastener is a quarter turn fastener.

4. The fixture of claim 1, wherein:
   the second panel includes a respective groove located on each of the second, third, and fourth peripheral edges which includes a respective second, third, and fourth RF gasket disposed within each groove.

5. The fixture of claim 4, further comprising:
   a third panel with a peripheral edge of the third panel that contacts the second RF gasket;
   a fourth panel with a peripheral edge of the fourth panel that contacts the third RF gasket; and
   a fifth panel with a peripheral edge of the fifth panel that contacts the fourth RF gasket.

6. The fixture of claim 5, further comprising:
   at least one fastener to secure the second panel to the third panel.

7. The fixture of claim 6, wherein:
   the fastener is a quarter turn fastener.

8. The fixture of claim 5, wherein:
   the second RF gasket is compressed by the peripheral edge of the third panel to a predetermined dimension, and provides an RF sealed connection between the second panel and the third panel.

9. The fixture of claim 5, wherein:
   the third RF gasket is compressed by the peripheral edge of the fourth panel to a predetermined dimension, and provides an RF sealed connection between the second panel and the fourth panel.

10. The fixture of claim 5, wherein:
    the fourth RF gasket is compressed by the peripheral edge of the fifth panel to a predetermined dimension, and provides an RF sealed connection between the second panel and the fifth panel.

11. The fixture of claim 1, wherein:
    the first panel includes a respective groove located on each of the second, third, and fourth peripheral edges which is continuous with the groove of the first peripheral edge, and includes a respective second, third, and fourth RF gasket disposed within each groove.

12. The fixture of claim 11, further comprising:
    a third panel with a peripheral edge of the third panel that contacts the second RF gasket;
    a fourth panel with a peripheral edge of the fourth panel that contacts the third RF gasket; and
    a fifth panel with a peripheral edge of the fifth panel that contacts the fourth RF gasket.

13. The fixture of claim 12, wherein:
    the second RF gasket is compressed by the peripheral edge of the third panel to a predetermined dimension, and provides an RF sealed connection between the first panel and the third panel.

14. The fixture of claim 12, wherein:
    the third RF gasket is compressed by the peripheral edge of the fourth panel to a predetermined dimension, and provides an RF sealed connection between the first panel and the fourth panel.

15. The fixture of claim 12, wherein:
    the fourth RF gasket is compressed by the peripheral edge of the fifth panel to a predetermined dimension, and provides an RF sealed connection between the first panel and the fifth panel.

16. An RF sealed fixture used in testing an RF device, the fixture comprises:
    a first panel with a peripheral edge groove positioned along a peripheral edge of the first panel which includes a first RF gasket positioned in the peripheral edge groove of the first panel;
    a second panel with a tongue protruding from a first peripheral edge of the second panel, with the tongue designed to fit into the peripheral edge groove of the first panel, the second panel includes a respective groove located on each of the second, third, and fourth peripheral edges and includes a respective second, third, and fourth RF gasket disposed within each groove;
    a third panel with a peripheral edge of the third panel that contacts the second RF gasket;
    a fourth panel with a peripheral edge of the fourth panel that contacts the third RF gasket; and
    a fifth panel with a peripheral edge of the fifth panel that contacts the fourth RF gasket;
    wherein the first RF gasket is compressed by an insertion of the tongue of the second panel to a predetermined dimension, and provides an RF sealed connection between the first panel and the second panel;
    the second RF gasket is compressed by the peripheral edge of the third panel to a predetermined dimension, and provides an RF sealed connection between the second panel and the third panel;
    the third RF gasket is compressed by the peripheral edge of the fourth panel to a predetermined dimension, and provides an RF sealed connection between the second panel and the fourth panel; and
    the fourth RF gasket is compressed by the peripheral edge of the fifth panel to a predetermined dimension, and provides an RF sealed connection between the second panel and the fifth panel.

17. The fixture of claim 16, further comprising:
    at least one fastener to secure the second panel to the third panel.

18. The fixture of claim 17, wherein:
    the fastener is a quarter turn fastener.

19. The fixture of claim 16, further comprising:
    a sixth panel which is connected to the first, third, fourth, and fifth panels;
    wherein all connections between the first, second, third, fourth, fifth, and sixth panels are RF sealed connections.

* * * * *